(12) United States Patent
Perrin et al.

(10) Patent No.: US 11,554,989 B2
(45) Date of Patent: Jan. 17, 2023

(54) PRODUCTION METHOD INCORPORATING PARTICLES CONTAINING SILICON

(71) Applicant: NANOMAKERS, Rambouillet (FR)

(72) Inventors: Jean-François Perrin, Vélizy-Villacoublay (FR); Yohan Oudart, Versailles (FR)

(73) Assignee: NANOMAKERS, Rambouillet (FR)

( * ) Notice: Subject to any disclaimer, the term of this patent is extended or adjusted under 35 U.S.C. 154(b) by 0 days.

(21) Appl. No.: 16/956,314

(22) PCT Filed: Dec. 12, 2018

(86) PCT No.: PCT/EP2018/084624
§ 371 (c)(1),
(2) Date: Jun. 19, 2020

(87) PCT Pub. No.: WO2019/121261
PCT Pub. Date: Jun. 27, 2019

(65) Prior Publication Data
US 2021/0078911 A1   Mar. 18, 2021

(30) Foreign Application Priority Data

Dec. 22, 2017 (FR) ...................................... 1762931

(51) Int. Cl.
*H01M 4/04* (2006.01)
*C04B 35/83* (2006.01)
(Continued)

(52) U.S. Cl.
CPC .............. *C04B 35/83* (2013.01); *C01B 33/02* (2013.01); *H01L 31/1804* (2013.01);
(Continued)

(58) Field of Classification Search
CPC ........ H01M 4/38; H01M 4/366; H01M 4/622; H01M 10/0525; H01M 4/04; H01M 4/36;
(Continued)

(56) References Cited

U.S. PATENT DOCUMENTS

2012/0321959 A1    12/2012  Yushin et al.
2013/0029232 A1 *   1/2013  Zheng ............... H01M 10/0525
                                                      429/338
(Continued)

FOREIGN PATENT DOCUMENTS

CN        102332571 B      12/2012
DE    102007044565 A1 *     4/2009  ................ B22F 3/02
JP       2013203626 A      10/2013

OTHER PUBLICATIONS

French Search Report from French Patent Application No. 1762931, dated Jun. 20, 2018.
(Continued)

*Primary Examiner* — Khanh T Nguyen
(74) *Attorney, Agent, or Firm* — Greer, Burns & Crain, Ltd

(57) ABSTRACT

A production method is provided in which submicronic particles containing silicon are incorporated into a matrix, wherein, during the incorporation of the particles, the particles are in a compacted state with a bulk density of more than 0.10 grams per cubic centimeter, and the compacted particles have a specific surface area at least 70% of that of the particles considered separately without contact between each other.

12 Claims, 2 Drawing Sheets

(51) Int. Cl.
*C01B 33/02* (2006.01)
*H01L 31/18* (2006.01)
*H01M 4/38* (2006.01)
*H01M 4/62* (2006.01)
*H01L 31/0445* (2014.01)

(52) U.S. Cl.
CPC ......... *H01M 4/0404* (2013.01); *H01M 4/386* (2013.01); *H01M 4/625* (2013.01); *C01P 2004/62* (2013.01); *C01P 2006/11* (2013.01); *C01P 2006/12* (2013.01); *C01P 2006/40* (2013.01); *C04B 2235/422* (2013.01); *C04B 2235/428* (2013.01); *C04B 2235/5248* (2013.01); *H01L 31/0445* (2014.12)

(58) Field of Classification Search
CPC ...... H01M 4/131; H01M 4/134; H01M 4/362; B22F 3/02; C23C 16/442; H01L 31/0445; C04B 35/83
See application file for complete search history.

(56) References Cited

U.S. PATENT DOCUMENTS

2013/0334468 A1 12/2013 Taniguchi et al.
2018/0013137 A1* 1/2018 Put ........................ H01M 4/362

OTHER PUBLICATIONS

International Search Report and Written Opinion for International Patent Application No. PCT/EP2018/084624, dated Feb. 13, 2019.
Japanese Office Action from Japanese Patent Application No. 2020-534835 dated Jul. 5, 2022 (6 pages).

* cited by examiner

PRODUCTION METHOD INCORPORATING PARTICLES CONTAINING SILICON

BACKGROUND

The present invention relates to a production method incorporating particles containing silicon. It also relates to the products and devices obtained from this method.

More particularly but non-limitatively, the field of the invention is that of metallic or ceramic materials or batteries or photovoltaic cells.

Methods for producing batteries incorporating particles containing silicon are known.

In fact, silicon can be used to increase the storage capacity of the battery.

The aim of the present invention is to propose a production method incorporating particles containing silicon, which is both practical to use (in particular in terms of safety and ease of handling) and yet the result obtained has a good quality.

SUMMARY

This objective is achieved with a production method in which submicronic particles containing silicon are incorporated into a matrix, characterized in that, during the incorporation of the particles:

the particles are in a compacted state with a bulk density of more than 0.10 grams per cubic centimeter, and
the compacted particles have a specific surface area at least 70% (preferably at least 90%) of that of the particles considered separately without contact between each other.

The specific surface area of the particles in their compacted state is typically a specific surface area determined by the Brunauer, Emmett and Teller method.

The specific surface area of the particles in their compacted state preferably corresponds to a measurement of specific surface area according to a Brunauer, Emmett and Teller (BET) method, i.e. by adsorption of dinitrogen on the surface of a known mass of the particles in their compacted state (typically using a BelSorp mini II instrument), by measurement of the quantity of dinitrogen necessary in order to have a monolayer of this gas on the surface of the particles (using the principle of the Brunauer, Emmett and Teller (BET) theory).

During the incorporation of the particles, the compacted particles preferably do not have covalent bonds between each other.

It is possible to spread out the particles previously incorporated into the matrix (this matrix being able to be modified or diluted after incorporation of the particles and before this spreading) on a conductive or semi-conductive support and to fix the particles to the support. It is possible to produce:

an electrode from the support on which a layer containing the particles is deposited. It is possible to produce a battery comprising said electrode, and/or
a photovoltaic panel from the support on which the particles are spread out.

The compacted particles can be obtained by a step of compacting starting from particles in a non-compacted state, such that during the compacting step the particles are not subjected to a temperature higher than 400° C.

The incorporation of the compacted particles into the matrix is preferably effected when the particles are without additives.

The particles preferably comprise a core of non-oxidized silicon.

The matrix preferably comprises carbon.

The matrix can be a metallic and/or ceramic matrix.

The matrix can be a liquid and/or solid matrix.

According to another aspect of the invention, a battery obtained using a method according to the invention is proposed.

According to another aspect of the invention, a photovoltaic panel obtained using a method according to the invention is proposed.

According to another aspect of the invention, a metallic or ceramic material obtained using a method according to the invention is proposed.

BRIEF DESCRIPTION OF THE DRAWINGS

Other advantages and features of the invention will become apparent on reading the detailed description of implementations and embodiments which are in no way limitative, and the following attached drawings.

DETAILED DESCRIPTION

Figure 1:
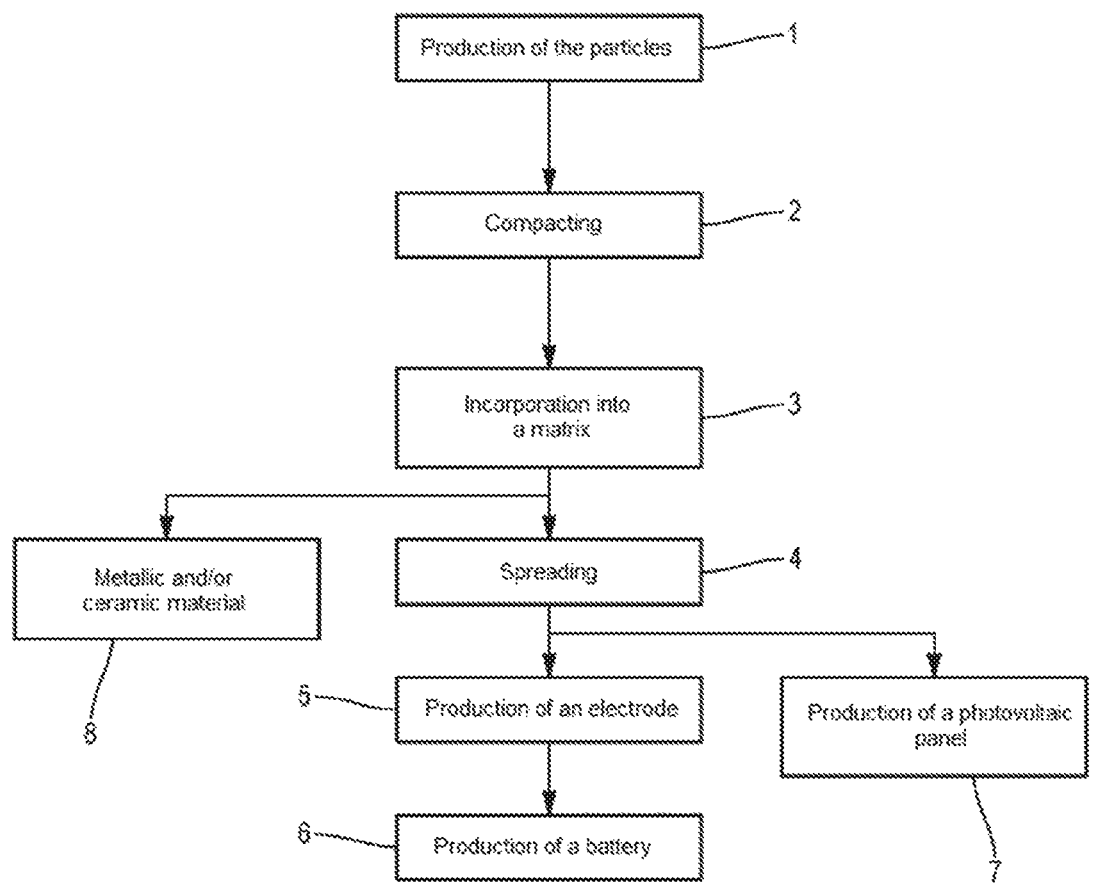
FIG. 1 is a flow chart of the steps of a first and a second embodiment of the method according to the invention.

These embodiments being in no way limitative, it will be possible in particular to consider variants of the invention comprising only a selection of characteristics described or illustrated hereinafter in isolation from the other characteristics described or illustrated (even if this selection is isolated within a sentence containing these other characteristics), if this selection of characteristics is sufficient to confer a technical advantage or to differentiate the invention with respect to the state of the prior art. This selection comprises at least one, preferably functional, characteristic without structural details, and/or with only a part of the structural details if this part alone is sufficient to confer a technical advantage or to differentiate the invention with respect to the state of the prior art.

First of all, the common points between a first and a second embodiment of the method according to the invention will be described.

These embodiments comprise a step 1 of producing particles, typically by laser pyrolysis, for example according to the method described in the document WO2014009265.

These embodiments comprise a step 2 of compacting submicronic particles containing silicon, arranged to increase (preferably by at least 100%, and more preferably by at least 200%) the bulk density of the submicronic particles from an initial bulk density Di of the particles to a final bulk density Df of the particles (i.e. preferably (Df−Di)/Di≥100% or even 200%).

Each particle can be constituted by a collection of spheres linked by covalent bonds.

The compacting step is implemented for example by:

compression by means of a press or a calendering system (passing between two rollers) making it possible to exert a pressure of at least 20 bars on the powder. The thus-compacted powder has the same specific surface area as the loose powder but a density of more than 150 g/L. Such a method is described for example in the following article: R. Vaßen and D. Stöver, Powder Technology, 72 (1992) 223-226; and/or rotary granulation: this consists of introducing the powder into a cylindrical container (from 5 to 500 cm in diameter, preferably between 10 and 200 cm in diameter) and rotating it for several hours in order to obtain granulated powder, the density of which exceeds 100 g/L; the longer the rotation time, the greater the density. The rotation must be effected about the axis of the center of the container according to the longest axis of the cylindrical container. This axis can be inclined to a greater or lesser extent. Such a device is described in the patents US 2013/0330557 A1, U.S. Pat. Nos. 4,980,106, 6,231,624 B1.

The particles are not significantly modified by their compacting from the density Di (before compacting) to the density Df (after compacting); particles are not created, particles are not destroyed, particles are not fused together, new covalent bonds are not created between the particles, a particle is not separated into several pieces. They are the same particles at the bulk density Di before their compacting and at the bulk density Df after their compacting.

The compacted particles are obtained by this compacting step starting from the particles in a non-compacted state, such that during the compacting step the particles are not subjected to a temperature higher than 400° C. In fact, above that temperature the particles can form new covalent bonds between each other (sintering) and thus lose their natures and their nanometric properties.

These embodiments comprise a step 3 of incorporating submicronic particles containing silicon into a matrix.

Between the compacting of the particles and their incorporation into the matrix, the particles are not subjected to a temperature higher than 400° C. The creation of covalent bonds between the particles is thus avoided.

By "submicronic particle" is meant in the present description a particle where the smallest of the dimensions linking two points of the circumference of this particle is less than 1000 nm, preferably less than 300 nm, preferably less than 150 nm.

By particle "containing silicon" is meant in the present description a particle comprising a core composed of at least 90% by mass oxidized or non-oxidized silicon or a mixture of the two.

By "matrix" is meant the material (preferably solid and/or liquid) into which the submicronic particles are incorporated.

The matrix is a liquid or solid (for example powder) matrix or both (for example gel or paste), containing carbon (for the production of a battery, electrode, photovoltaic panel) or not (for example metallic or ceramic for the production of new materials with interesting properties).

Preferably, each particle containing silicon is composed of at least 80% by mass oxidized or non-oxidized silicon or a mixture of the two, i.e. for the entirety formed by the core of this particle and any upper layer(s) surrounding the core of this particle.

According to different examples, the core of each submicronic particle can comprise for example (preferably homogeneously for all the submicronic particles used):
Si, preferably 100% Si or at least 80% Si by mass mixed with other elements or dopants,
$SiO_2$, preferably 100% $SiO_2$ or at least 80% $SiO_2$ by mass mixed with other elements or dopants,
a mixture of $SiO_2$ and Si, preferably between 20 and 60 mole % $SiO_2$ and from 40 to 80 mole % Si, preferably for a total by mass of Si and $SiO_2$ of 100% or at least 80% mixed with other elements or dopants.

The core of each submicronic particle can be coated with at least one layer situated around the core, for example a layer comprising carbon or a layer of pure carbon, or a layer of polymer.

Typically, each particle comprises a core of non-oxidized silicon.

Typically, the core of each particle is surrounded by a layer of carbon.

During the incorporation of the compacted particles into the matrix (i.e. just before the particles come into contact with the matrix), the particles are without additives. In other words, during the incorporation of the particles, these particles are not mixed with anything else (other particles of another type, or a solvent, etc.) before coming into contact with the matrix.

In these embodiments of the method according to the invention, during the incorporation of the particles (i.e. when the particles come into contact with the matrix), the particles are in a compacted state with a bulk density Df of more than 0.10 grams per cubic centimeter, preferably more than 0.15 grams per cubic centimeter.

In these embodiments of the method according to the invention, during the incorporation of the particles, the compacted particles do not have covalent bonds between each other, i.e. no new covalent bonds compared with their state before compacting.

In these embodiments of the method according to the invention, during the incorporation of the particles, the particles compacted to the bulk density Df have a specific surface area at least 70% (and even at least 90%) of that of the particles considered separately without contact between each other or at the bulk density Di.

By "apparent" or "bulk" density (also called volumetric density) is meant a value that is well-known and clear to a person skilled in the art. It is a value used with substances in the form of powder or granules, in order to summarize the mass M of material contained in a given total volume Vtot, this total volume comprising the volume of interstitial air between the granules or particles or grains of the powder. From this point of view, the volumetric density p of one and the same granulated or powdered material can vary according to whether it is more or less packed or, conversely, aerated:

$$\rho = \frac{M}{Vtot}$$

Usage dictates that this volumetric density is generally expressed in grams per cubic centimeter (g·cm−3) or grams per liter.

The measurement of bulk density is based on the protocol ISO 3923-2 in its latest version in force on 22 Dec. 2017 (ISO 3923-2:1981).

The specific surface area of the particles (which denotes the ratio of the surface area of the actual surface of the particles (as opposed to their apparent surface) and the quantity of material of the particles (i.e. their mass)) does not change or does not change appreciably between the bulk densities Di and Df.

In the present description, the measurement of the specific surface area is effected by adsorption of a gas (more precisely of dinitrogen) on the surface of a material of known mass (for example a known mass of the particles in their compacted state). The principle is to measure the quantity of dinitrogen necessary in order to have a monolayer of this gas on the surface. It uses the principle of the Brunauer, Emmett and Teller (BET) theory. The instrument used is a BelSorp mini II. In the following, specific surface area or BET surface area are mentioned interchangeably.

The instrument uses dinitrogen as measurement gas, taking into account the volume of gas adsorbed and the mass of sample.

The measurement of specific surface area is based on the static volumetric method from the standard ISO 9277:2010 (E) in its latest version in force on 22 Dec. 2017.

In this way, the particles compacted to density Df are arranged in order to be simply dispersed in the matrix (preferably in solution, preferably in water at 20° C. in less than 10 hours), possibly with the aid of ultrasound or stirring or a mixer in order to speed up this dispersion.

However, it is noted that the particles compacted to density Df are not soluble in the matrix.

They are the same particles after their compacting to the density Df and after their dispersion in the matrix: particles are not created, particles are not destroyed, particles are not fused together, particles are not separated into several pieces (which is therefore very different from a state of the art of a sintering, creating new covalent bonds, followed by a grinding).

The matrix can then be modified and/or dried and/or diluted and/or mixed in another matrix or with another matrix and/or with additives and/or with solvents.

The first embodiment comprises a spreading out 4, on a conductive or semi-conductive support, of the particles previously incorporated into the matrix, and the particles are fixed to the support in this way.

This spreading of the particles can be effected when the matrix has optionally been modified, for example dried or concentrated, and/or again diluted or mixed in another matrix or with another matrix and/or with additives and/or with solvents.

By "conductive" is meant that the material of the support in contact with the layer of matrix spread out on the support has an electrical resistance of less than 0.01 $\Omega \cdot m$.

By "semi-conductive" is meant that the material of the support in contact with the layer of matrix spread out on the support has an electrical resistance of less than 10,000 $\Omega \cdot m$ and preferably of more than 0.01 $\Omega \cdot m$.

For the battery the matrix contains carbon for example: it comprises carbon, for example graphite and/or "Super P" and/or carboxymethyl cellulose, preferably at least graphite. It is possible for example to incorporate 12% by mass submicronic particles having a core of non-oxidized silicon covered by a layer of carbon with 68% by mass graphite and 10% by mass Timcal Super P. Between the incorporation of the particles into the matrix and the spreading on the support, adjustment steps known to a person skilled in the art are carried out:
- adjustment of the viscosity of the particles incorporated into the matrix, for example with water, and/or
- mixing of the particles in the matrix, for example 20 minutes at 700 rpm.

The support is for example a copper sheet 10 µm thick.

The spreading is typically effected using a spreading blade moving at 5 centimeters per second and set to deposit a layer 100 µm thick of particles incorporated into the matrix.

After the particles have been spread out on the support, adjustment steps known to a person skilled in the art are carried out:
- drying of the particles spread out on the support, for example 12 hours in an air furnace at 80° C., for a final quantity of dry matter after drying deposited on the support of approximately 2 mg·cm$^{-2}$, and/or
- cutting of the support.

The following is then selectively produced:
- an electrode (step 5), more exactly an anode, from the support on which a layer containing the particles has been deposited. Then (step 6) a battery is produced comprising said electrode, a separator and a cathode, everything being in contact with a liquid or solid electrolyte,
- a photovoltaic panel (step 7) from the support on which the particles, which are then thermally treated for example, are spread out.

Different examples of batteries A to G below illustrate the technical advantages of the method according to the invention, which are the batteries C to G.

Battery A: Non-Submicronic Particles 18 parts of micrometric silicon (mesh 325, powder A) are dry-mixed with 35 parts of nanometric carbon (Super P), and 35 parts of carbon fibers (VGCF). This mixture is then brought into contact with an aqueous solution containing 12 parts of CMC (carboxymethyl cellulose).

The thus-obtained ink is spread out on a copper sheet (thickness 17.5 µm). The sheet dries in the open air. The pellets are cut and dried under vacuum at 90° C. They are then kept in a glove box, under a neutral argon atmosphere.

A half-cell is then produced: the electrode containing the silicon is brought into contact, under inert atmosphere, with a membrane, a lithium metal anode and an electrolyte composed of one volume of ethylene carbonate (EC), one volume of propylene carbonate (PC), three volumes of 3 dimethyl carbonate (DMC) as well as 5% fluoroethylene carbonate (FEC) and 1% vinyl carbonate (VC).

In the end, the battery A is obtained.

Batteries B (Bulk Density<0.1 g·Cm$^{-3}$) and C to G (Bulk Density>0.1 g·Cm$^{-3}$)

18 parts of silicon nanoparticles 40 nm in diameter according to their smallest axis with a bulk density (apparent density) Df of:
- 45 g/L or 0.045 g·cm$^{-3}$ (powder B for battery B), or
- 108 g/L 0.108 g·cm$^{-3}$ (powder C for battery C), or
- 148 g/L 0.148 g·cm$^{-3}$ (powder D for battery D), or
- 180 g/L 0.180 g·cm$^{-3}$ (powder E for battery E), or
- 208 g/L 0.208 g·cm$^{-3}$ (powder F for battery F), or
- 320 g/L 0.320 g·cm$^{-3}$ (powder G for battery G)

Figure 2:
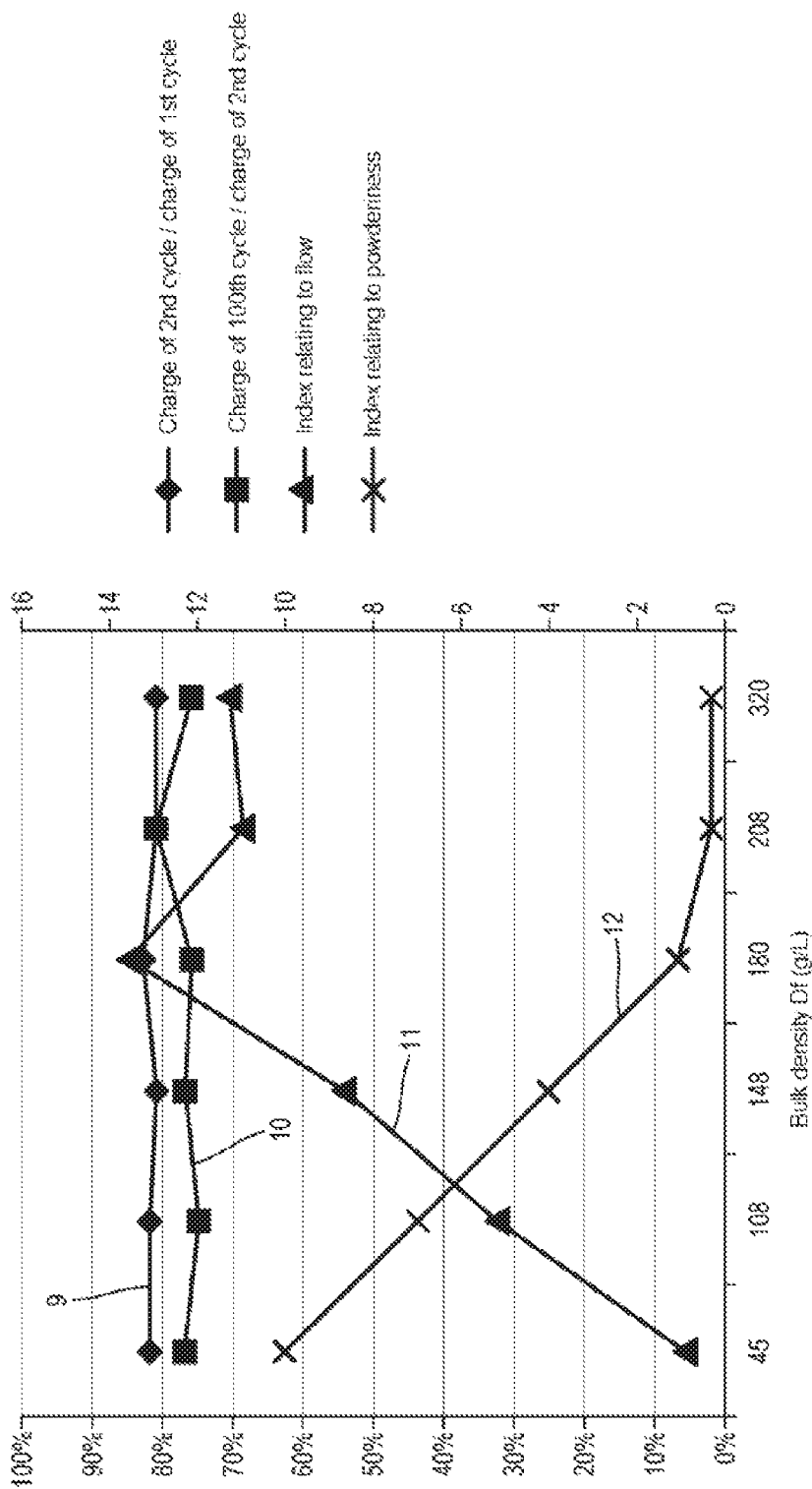
FIG. 2 illustrates different comparative results for the first embodiment of the method according to the invention.

(cf. X-axis of FIG. 2)

and respectively a BET surface area of:
- 43.6 m$^2$/g (powder B for battery B), or
- 43.7 m$^2$/g (powder C for battery C), or
- 43.2 m$^2$/g (powder D for battery D), or
- 43.4 m$^2$/g (powder E for battery E), or
- 43.1 m$^2$/g (powder F for battery F), or
- 43.3 m$^2$/g (powder G for battery G) are dry-mixed with 35 parts of nanometric carbon (Super P) and 35 parts of carbon fibers (VGCF). This mixture is then brought into contact with an aqueous solution containing 12 parts of CMC (carboxymethyl cellulose).

It is noted that, for the powders B to G, the non-compacted powder (corresponding to powder B) had the bulk density Di=45 g/L or 0.045 g·cm$^{-3}$ and had a BET surface area of 43.6 m$^2$/g.

The thus-obtained ink is spread out on a copper sheet (thickness 17.5 µm). The sheet dries in the open air. The pellets are cut and dried under vacuum at 90° C. They are then preserved in a glove box, under a neutral argon atmosphere.

A half-cell is then produced: the electrode containing the silicon is brought into contact, under inert atmosphere, with a membrane, a lithium metal anode and an electrolyte composed of one volume of ethylene carbonate (EC), one volume of propylene carbonate (PC), three volumes of 3 dimethyl carbonate (DMC) as well as 5% fluoroethylene carbonate (FEC) and 1% vinyl carbonate (VC).

The batteries A to G obtained were tested under the following conditions:

An initial cycle comprising:
- an OCV ("open-circuit voltage") of 2 hours
- a C20 discharge limited to 1 mA and 1.5 mA
- followed by a C20 charge with the same absolute value
- followed by a $2^{nd}$, $3^{rd}$, $4^{th}$, ... $100^{th}$ cycle, each cycle comprising:
- a C5 discharge limited to 1 mA and 1.5 mA
- followed by a C5 charge with the same absolute value.

The voltage is limited between 0.01 V and 1.5 V

Table 1 below shows the cycling results for batteries A to G.

TABLE 1

| Battery | Bulk density during the incorporation into the matrix (g/L) | Initial charge capacity (mAh/g) | Charge capacity of the 2nd cycle/charge capacity of the 1st cycle (curve 9 of FIG. 2) | Charge capacity of the 100th cycle/charge capacity of the 2nd cycle (curve 10 of FIG. 2) |
|---|---|---|---|---|
| A | 910 | 825 | <80% | <50% |
| B | 45 | 810 | 82% | 77% |
| C | 108 | 790 | 82% | 75% |
| D | 148 | 804 | 81% | 77% |
| E | 180 | 820 | 83% | 76% |
| F | 208 | 795 | 81% | 81% |
| G | 320 | 810 | 81% | 76% |

It is noted that the use of submicronic powders according to the invention is very advantageous compared with the case of battery A. A surprising technical effect is observed. Despite the size of the agglomerates of the densified powder, the performance of the batteries remains similar to the loose powder. In fact, the densified powder contains micrometric agglomerates, but the properties of which remain those of the loose nanometric particles, rather than that of the micrometric powder.

406 milliliters of powder A, B, C, D, E, F or G filling to the top of a container 71.8 mm in diameter is emptied all at once into a funnel 119.48 mm in diameter (at the top) and 29.8 mm in diameter at the bottom over a flask. The flow time is measured and corresponds to the time at the end of which the funnel is empty. The results are given in mass transferred per unit of time. The reference is the non-granulated powder B, the value of which was fixed at 1 and the bulk density of which is Di=45 g/L. The index relating to flow is calculated using the formula:

(mass of Si transferred/transfer time)$_{powder\ A,B,C,D,E,F\ or\ G}$/(mass of Si transferred/transfer time)$_{non\text{-}compacted\ nano\ Si\ product}$ The results are listed in Table 2 below:

TABLE 2

| Powder | Bulk density of the powder (g/L) | Index relating to flow (curve 11 of FIG. 2) |
|---|---|---|
| A | 910 | 16 |
| B | 45 | 1 |
| C | 108 | 5.2 |
| D | 148 | 8.7 |
| E | 180 | 13.6 |
| F | 208 | 11 |
| G | 320 | 11.3 |

The submicronic powder B at low bulk density flows much less well than the micronic powder. According to the invention, when the bulk density of the powder is higher (powders C to G), the index relating to flow increases significantly and approaches that of the micronic powder.

406 milliliters of powder A, B, C, D, E, F or G filling to the top of a container 71.8 mm in diameter is emptied all at once into a funnel 119.48 mm in diameter (at the top) and 29.8 mm in diameter at the bottom over a flask. The height of the cloud of powder above the funnel is measured. The reference is the non-compacted powder B, the value of which was fixed at 10 and the bulk density of which is Di=45 g/L. The index relating to powderiness is calculated using the formula:

10×(cloud height of Si transferred)$_{powder\ A,B,C,D,E,F\ or\ G}$/(cloud height of Si transferred)$_{non\text{-}compacted\ nano\ Si\ product}$ The results are listed in Table 3 below:

TABLE 3

| Powder | Bulk density of the powder (g/L) | Index relating to powderiness (curve 12 of FIG. 2) |
|---|---|---|
| A | 910 | 7 |
| B | 45 | 10 |
| C | 108 | 7 |
| D | 148 | 4 |
| E | 180 | 1 |
| F | 208 | 0.3 |
| G | 320 | 0.3 |

Powder C, D, E, F or G used according to the invention is significantly less powdery than the loose submicronic powder B, and is even significantly less powdery than the micronic powder A from a granulation density of 150 g/L (powder D).

It is noted that the powders C, D, E, F and G used according to the invention with Df>0.1 g·cm−3 are the only ones to accumulate good battery qualities (charge of 100th cycle/charge of 2nd cycle≥75%) while having a satisfactory flow and powderiness (and even more particularly for Df>0.15 g·cm−3) and therefore satisfactory operating and safety conditions.

In the second embodiment, the matrix is a matrix that is:
metallic, i.e. having metallic bonds; such as for example copper, aluminum, iron, nickel, chromium, cobalt, titanium, manganese, lithium, scandium, and/or a mixture of these elements ceramic (i.e. having a vitrified or non-vitrified body, crystalline or partially crystalline structure, or glassy amorphous, the body of which is formed of essentially inorganic and non-metallic substances, and which is formed by a molten mass which solidifies on cooling, or which is formed and brought to maturity, at the same time or later, by the action of heat); such as for example the ceramics containing silicon, aluminum, boron, tungsten, zirconium, in the form of carbides, nitrides or oxides.

The technical advantages are the same in terms of powderiness and flow as in the first embodiment.

The incorporation of the particles is effected when the matrix is in the solid state (for example a matrix in the form of powder, the particles and the matrix being linked thereafter by sintering or fusing) or the liquid state (for example molten metal).

Of course, the invention is not limited to the examples that have just been described, and numerous adjustments can be made to these examples without departing from the scope of the invention.

Of course, the different characteristics, forms, variants and embodiments of the invention can be combined with each other in various combinations unless they are incompatible or mutually exclusive.

The invention claimed is:

1. A production method comprising the following steps;
providing compacted submicronic particles containing silicon having a compacted state with a bulk density and a specific surface area; and
incorporating the submicronic particles containing silicon in a matrix in such a way that when the submicronic particles containing silicon come into contact with the matrix:
the compacted submicronic particles containing silicon have a specific surface area of at least 70% to 100% of a surface area of non-compacted submicronic particles; and
the submicronic particles containing silicon are in a compacted state with the bulk density being more than 0.10 grams per cubic centimeter and up to an upper limit of compaction corresponding to the lower limit of the specific surface area of the submicronic particles of at least 70% of a surface area of non-compacted submicronic particles.

2. The method according to claim 1, wherein, during the incorporation of the submicronic particles containing silicon, the compacted submicronic particles do not have covalent bonds between each other.

3. The method according to claim 1, wherein the submicronic particles containing silicon previously incorporated into the matrix are spread out on a conductive or semiconductive support, and the submicronic particles containing silicon are fixed to the support.

4. The method according to claim 3, wherein an electrode is produced from the support on which a layer containing the submicronic particles containing silicon is deposited.

5. The method according to claim 4, wherein a battery comprising said electrode is produced.

6. The method according to claim 3, wherein a photovoltaic panel is produced from the support on which the submicronic particles containing silicon are spread out.

7. The method according to claim 1, wherein the compacted submicronic particles containing silicon are obtained by a step of compacting starting from the submicronic particles in a non-compacted state, such that during the compacting step the particles are not subjected to a temperature higher than 400° C.

8. The method according to claim 1, wherein the incorporation of the compacted submicronic particles containing silicon into the matrix is effected when the submicronic particles containing silicon are without additives.

9. The method according to claim 1, wherein the submicronic particles containing silicon comprise a core of non-oxidized silicon.

10. The method according to claim 1, wherein the matrix comprises carbon.

11. The method according to claim 1, wherein the matrix is at least one of a metallic matrix and a ceramic matrix.

12. The method according to claim 1, wherein the matrix is at least one of a liquid matrix and a solid matrix.

* * * * *